United States Patent [19]

Chassaing et al.

[11] Patent Number: 4,804,924
[45] Date of Patent: Feb. 14, 1989

[54] DIGITAL DOUBLE DEMODULATOR

[75] Inventors: Françoise Chassaing, Melesse; Jean Chatel, Rennes, both of France

[73] Assignees: L'Etat Francais Represente Par le Ministre Des Ptt (CNET), Issy-les-Moulineaux; Etablissement Public Telediffusion de France, Paris, both of France

[21] Appl. No.: 125,498

[22] PCT Filed: Mar. 9, 1987

[86] PCT No.: PCT/FR87/00061
§ 371 Date: Oct. 27, 1987
§ 102(e) Date: Oct. 27, 1987

[87] PCT Pub. No.: WO87/05758
PCT Pub. Date: Sep. 24, 1987

[30] Foreign Application Priority Data

Mar. 13, 1986 [FR] France ............................... 86 03582

[51] Int. Cl.$^4$ .............................................. H03D 5/00
[52] U.S. Cl. ........................................ 329/1; 329/110; 358/23; 455/142
[58] Field of Search ...................... 329/1, 2, 104, 109, 329/110, 145; 455/142, 143, 205, 337; 358/23, 24; 375/39

[56] References Cited

U.S. PATENT DOCUMENTS 4,090,145 5/1978 Webb ...................................... 329/1

FOREIGN PATENT DOCUMENTS

| 0029376 | 5/1981 | European Pat. Off. . |
| 0046103 | 2/1982 | European Pat. Off. . |
| 0068579 | 1/1983 | European Pat. Off. . |
| 0068571 | 1/1983 | European Pat. Off. . |
| 0074858 | 3/1983 | European Pat. Off. . |
| 0107884 | 5/1984 | European Pat. Off. . |
| 0166806 | 1/1986 | European Pat. Off. . |

Primary Examiner—Eugene R. LaRoche
Assistant Examiner—Robert J. Pascal
Attorney, Agent, or Firm—Oblon, Fisher, Spivak, McClelland & Maier

[57] ABSTRACT

A demodulator including a Hilbert transformer (20), a carrier regenerating circuit (30), a first delay line (35), a second delay line (36), a first switching device (38), a second switching device (39), a first multiplier (40), a second multiplier (42), a second adder (44), a third switching device (46), a third multiplier (48), a fourth switching device (50), a fourth multiplier (52), a second adder (54) and a divider circuit (60). This demodulator is able to demodulate either a frequency modulated signal, or a signal with double amplitude modulation in quadrature and with suppressed carrier.

4 Claims, 10 Drawing Sheets

DIGITAL DOUBLE DEMODULATOR

BACKGROUND OF THE INVENTION

1. Field of the Invention

The present invention relates to a digital double demodulator.

The invention relates to signals transporting an information on a frequency, amplitude or phase-modulated carrier wave. Provided that there is a spectral compatibility of the modulations, it also applies to signals modulated both in amplitude and in frequency, or in amplitude and in phase, or to signals with double modulation of quadrature amplitude and suppressed carrier.

Thus, the invention particularly applies to television signals, especially to the demodulation of the chrominance signal of composite signals which, in the case of the SECAM system, is modulated in frequency and which, in the case of the PAL and NTSC systems, has undergone a double amplitude in quadrature modulation. It also applies to the demodulation of frequency-modulated signals used in video-recorders. It further applies to the demodulation of signals used in radiophony and data transmission, no matter whether the modulations have several phase, frequency or amplitude states. The performances obtained also permit applications in metrology, inter alia for instantaneous or non-instantaneous frequency measurements.

2. Discussion of the Background

The most widely known prior methods of frequency demodulation are of the analog type. Ratio or phase discriminators are of the earliest types. Systems are also known, whose operation is based on a period measurement, either by counting or by measuring the capacity charge. Although these methods are relatively adequate, they suffer from the disadvantage of leading to systems requiring sometimes difficult settings, of only accepting signals with a relatively limited band width and of being inappropriate for the digital processing of demodulated signals.

Digital methods dedicated to this type of demodulation have recently appeared, but hitherto none of them has led to completely satisfactory results. The various known algorithms are as follows:

1. Approximation Algorithms

The so-called "arc tangent" algorithm, in which the signal is sampled close to four times the carrier frequency and the position of the rotary vector associated therewith is estimated by calculating the arc tangent of the ratio of two samples approximately in quadrature. This not very accurate method suffers from the disadvantage of being closely linked with the sampling frequency used and of only permitting demodulation in a reduced frequency band. Such a method is e.g. described in FR-A-2 488 755.

Algorithm for estimating the zero passage points in which, on the basis of two samples of the modulated signal of opposite signs, using an interpolation method an estimate is made of the time at which the carrier is suppressed and as a result of this the period of the signal is calculated. This method requires a very high sampling frequency and is not very accurate, because the result is highly dependent on the quantification of the signal to be demodulated.

2. Division Algorithm

This method is based on the division of weighted sums of successive samples of the signal. Although theoretically accurate, calculations of this type cause problems of accuracy and stability for low values of the divider. It is therefore necessary to eliminate the results obtained when the divider is too small and to substitute them by results estimated on the basis of the preceding results or those immediately following the sought value. This leads to an inaccurate demodulated signal and which is in general very noisy. Such a method is e.g. described in FR-A-2 469 824, EP-A-107884, EP-A-68571 and EP-A-68579

3. Multiplication Algorithm

This consists of the transposition of a method used in analog form, according to which a product is formed between the modulated signal and said same signal passed through a delay line. The modulating signal is extracted from this result by low-pass filtering. In analog where, before demodulation, the signal passes through a limiter, said method gives good results. In digital, the limitation function has no sense, so that the signal demodulation according to this method is disturbed by all the amplitude distortions of the modulated signal, so that the result can again be very noisy.

With regards to the amplitude demodulation, the most widely known methods are also performed with analog circuits. The most sophisticated of them are so-called synchronous demodulations for which the carrier frequency, whether transmitted or not, is restored at the demodulator. The product between this wave and the signal to be demodulated permits, following low-pass filtering, the extraction of the modulating signal.

The known digital methods are a simple transposition of these analog methods. They lead to good results, but require relatively complicated low-pass filters.

SUMMARY OF THE INVENTION

The object of the invention is to propose a demodulator which, after setting, and under high, stable performance conditions permits:

a frequency demodulation, an amplitude demodulation, simultaneous frequency and amplitude demodulation or an amplitude control of the frequency-modulated signal, on the same basic structure, amplitude demodulation in the case of a double amplitude modulation in quadrature with suppressed carrier, phase demodulation, by the addition of a simple switching, the performance of a double frequency or amplitude demodulation, the latter possibility more particularly applying to television signal decoders operating in NTSC, PAL or SECAM.

On functioning as a frequency demodulator, the proposed system has very high performance characteristics in terms of the signal to noise ratio of the output signal and is insensitive to the distortions of the input signal and distortions in the amplitude-frequency responses of the preceding circuits. The stability of the result is guaranteed at all points and there is no need to make use of devices for masking imprecise results. The linearity of the demodulator is also perfectly controlled. It is strictly linear or accurately compensates a voltage-frequency characteristic which, at the demodulator, would be non-linear.

When functioning in amplitude demodulation, the system proposed by the present invention has just as high performance characteristics as a system operating on the basis of a conventional algorithm, but without requiring the use of low-pass filters for extracting the demodulated signal.

The proposed demodulator was the object of a profound study in the case of the chrominance signals used in PAL and SECAM color television systems, which are respectively modulated in amplitude (double modulation in quadrature with suppressed carrier) and in frequency. The performance characteristics obtained are identical for both systems and, for the PAL system, slightly superior to those obtained with conventional means.

The demodulator according to the invention is double in the sense that it can process two modulated signal types, namely signals modulated in frequency and in phase, or in amplitude and signals having undergone a double amplitude modulation in quadrature and with suppressed carrier. By switching the switching devices it is possible to pass from one mode to the other. These switching devices have two inputs, one for the demodulation of frequency (or phase) and amplitude and the other for the double demodulation of amplitude with suppressed carrier. However, both make use of common means, which are firstly constituted by a Hilbert transformer, which receives the sequence of samples from the modulated signal and supplies two sample sequences in quadrature, then multipliers making it possible to obtain products between samples of the signal or samples of subcarriers and finally adders which form the sums (or differences) of these products.

BRIEF DESCRIPTION OF THE DRAWINGS

The features of the invention will become more readily apparent from the following description of non-limitative, illustrative embodiments with reference to the attached drawings, wherein show.

DESCRIPTION OF THE PREFERRED EMBODIMENTS

Before describing the structure of the demodulator according to the invention, certain theoretical considerations will be developed, in connection with the form taken by the signals according to the different possible modulations.

Firstly, with regards to the frequency modulation, it is pointed out that a frequency-modulated wave is generally expressed in the form:

$$s(t) = A \cdot \cos 2\pi \left( f_0 t + \Delta f_0 \int_0^t m(u) du \right)$$

with as parameters:
A=modulated signal amplitude
$f_o$=center frequency of modulator
$\Delta f_o$=frequency swing of modulator
m(t)=modulating signal.

In sampled form, T representing the sampling period, this expression becomes:

$$s(nT) = A \cdot \cos 2\pi \left( f_0 nT + k\Delta f_0 T \sum_0^n m(nT) \right)$$

or
$$s(nT) = A \cdot \cos\phi(nT) \quad \text{(R1)}$$
with $$\phi(nT) = 2\pi T \left( nf_0 + k\Delta f_0 \sum_0^n m(nT) \right)$$

Phase $\phi(nT)$, which is hereinafter designated $\phi(n)$, can assume a recursive form:

$$\phi(n) = \phi(n-1) + \Delta\phi(n)$$

with:

$$\Delta\phi(n) = 2\pi T(f_o + k\Delta f_o \cdot m(n)) \quad \text{(R2)}$$

$\Delta\phi(n)$ representing the phase increment of the frequency-modulated wave during each sampling period.

In order to respect the sampling theorem, $\Delta\phi(n)$ must remain between 0 (continuous signal) and $\pi$ (signal whose frequency is half the sampling frequency).

Taking account of the biunivocal character of relation R2, in order to know the value of the modulating signal (m(n) at time t=nT, it is sufficient to determine $\Delta\phi(n)$ and vice versa. The following remarks apply with regards to the frequency demodulation. It is a question of processing an analog signal of form:

$$s(t) = A(t) \cdot \cos\phi(t)$$

In this expression, the term A(t) represents the amplitude of the modulated signal which, at the reception level, is liable to fluctuate during time as a result of disturbances having various origins, such as the variaion in the power received, distortions to the amplitude-frequency responses of the preceding circuits, etc. Signal s(t) is applied to an analog-digital converter, which samples it at all times t=nT and digitizes it with an appropriate number of bits. This leads to the sequence: $s(n)=A(n)\cos\phi(n)$ which is processed by the demodulator according to the invention.

In the means according to the invention, this sequence is firstly applied to a Hilbert transformer in order to have two in quadrature versions of the modulated signal. Thus, respectively on each of the outputs one obtains:

$$x(n)=A(n)\cdot\cos\phi(n)$$

and $$y(n)=A(n)\cdot\sin\phi(n)$$

and for the following sample:

$$x(n+1)=A(n+1)\cdot\cos(\phi(n)+\Delta\phi(n+1))$$

and $$y(n+1)=A(n+1)\cdot\sin(\phi(n)+\Delta\phi(n+1))$$

$\Delta\phi(n+1)$ representing the phase increment between the samples n and n+1.

On the basis of these four expressions, it is possible to calculate various quantities $E_0(n)$, $E_1(n)$ $m(n)$:

$$E_0(n)=x(n)y(n+1)-y(n)x(n+1) \quad \text{(R4)}$$

or $$E_0(n)=A(n)A(n+1)[\sin(\phi(n)+\Delta\phi(n+1))\cdot\cos\phi(n)-\sin\phi(n)\cdot\cos(\phi(n)+\Delta\phi(n+1))]$$

or finally $$E_0(n)=A(n)A(n+1)\cdot\sin\Delta\phi(n+1)$$

or the expression $$E_1(n)=x(n)\cdot x(n+1)+y(n)\cdot y(n+1) \quad \text{(R5)}$$

or $$E_1(n)=A(n)A(n+1)[\cos\phi(n)\cdot\cos(\phi(n)+\Delta\phi(n+1))+\sin\phi(n)\cdot\sin(\phi(n)+\Delta\phi(n+1))].$$

or finally:

$$E_1(n)=A(n)A(n+1)\cdot\cos\Delta\phi(n+1)$$

According to the expression retained, thus it is possible to obtain the increment $\Delta\phi$ by means of its sine or cosine having a coefficient substantially equal to the square of the amplitude of the modulated signal. It is then possible to calculate:

$$M(n) = x^2(n) + y^2(n) \quad \text{(R6)}$$
$$M(n) = A^2(n)(\cos^2\phi(n) + \sin^2\phi(n))$$

$$M(n) = A^2(n) \text{ or } A(n) = \sqrt{M(n)}$$

Thus:

$$\sin\Delta\phi(n+1) = \frac{E_0(n)}{\sqrt{M(n)\cdot M(n+1)}} \simeq \frac{E_0(n)}{M(n)} \simeq \frac{E_0(n)}{M(n+1)} \quad \text{(R7)}$$

or:

$$\cos\Delta\phi(n+1) = \frac{E_1(n)}{\sqrt{M(n)M(n+1)}} \simeq \frac{E_1(n)}{M(n)} \simeq \frac{E_1(n)}{M(n+1)} \quad \text{(R8)}$$

According to the case, it would be possible to extract the modulating signal by one or other of the relations:

$$m(n) = \frac{1}{k\Delta f_0}\left[\frac{1}{2\pi T}\cdot\text{Arc sin}\left(\frac{E_0(n)}{M(n)}\right) - f_0\right] \quad \text{(R9)}$$

$$m(n) = \frac{1}{k\Delta f_0}\left[\frac{1}{2\pi T}\cdot\text{Arc cos}\left(\frac{E_1(n)}{M(n)}\right) - f_0\right] \quad \text{(R10)}$$

In summarizing, starting with a digitized signal s(n), whereof two versions x(n) and y(n) are determined in quadrature, it is possible to calculate a quantity E(n) (either in form $E_0(n)$, or in form $E_1(n)$) and a quantity M(n). The quotient of these two quantities immediately leads to the value of the sought modulating signal.

As regards the amplitude or phase demodulation for the double modulation signals in quadrature and suppressed carrier, the modulated wave has the expression:

$$s(t) = U(t)\cos\omega t + V(t)\sin\omega t = A(t)\cdot\cos(\omega t - \theta(t))$$

in which U(t) and V(t) are two amplitude modulation components, each modulating a carrier. These two carriers have the same frequency, but are phase-displaced by 90°.

The two modulation components can be considered as independent or as being orthogonal projections of a vector of length A(t) forming an angle $\theta(t)$ with respect to a reference. The problem of the demodulation will therefore be to determine one of the pairs U(t), V(t) or A(t), $\theta(t)$.

In sampled form, the modulated wave expression becomes:

$$s(nT) = U(nT)\cos n\omega T + V(nT)\sin n\omega T = A(nT)\cos(n\omega T - \theta(nT)).$$

In order to demodulate a signal of this type, it is necessary to have a reference for regenerating the carrier and more specifically for regenerating two subcarriers in quadrature:

$$X(n) = A\cos n\omega T$$

and $$Y(n) = A\sin n\omega T.$$

The signal s(nT) can then be applied to a Hilbert transformer, which supplies two versions thereof x(n) and y(n) in quadrature, as for the aforementioned frequency demodulation. Assuming the rear quadrature, it becomes:

$$x(n) = U(n)\cos n\omega T + V(n)\sin n\omega T$$

$$y(n) = U(n)\cos(n\omega T - \pi/2) + V(n)\sin(n\omega T - \pi/2)$$

$$y(n) = U(n)\sin nT - V(n)\cos nT.$$

It is clear that it is possible to extract therefrom U(n) and V(n) by means of the following operations:

$$A \cdot U(n) = x(n)X(n) + y(n)Y(n) \quad (R11)$$

$$A \cdot V(n) = x(n)Y(n) - y(n)X(n) \quad (R12)$$

Having determined U(n) or V(n), it is possible, if wished, to determine A(n) and $\theta(n)$ due to the fact that $U(n) = A(n) \cos \theta(n)$ and that $V(n) = A(n) \sin \theta(n)$. The quantities U(n) and V(n) are then applied either to a read-only memory equivalent to a table, or to a calculating system, which supplies the information in form A(n), $\theta(n)$.

After having given these theoretical considerations, the structure of the apparatus according to the invention will now be described.

Figure 1:
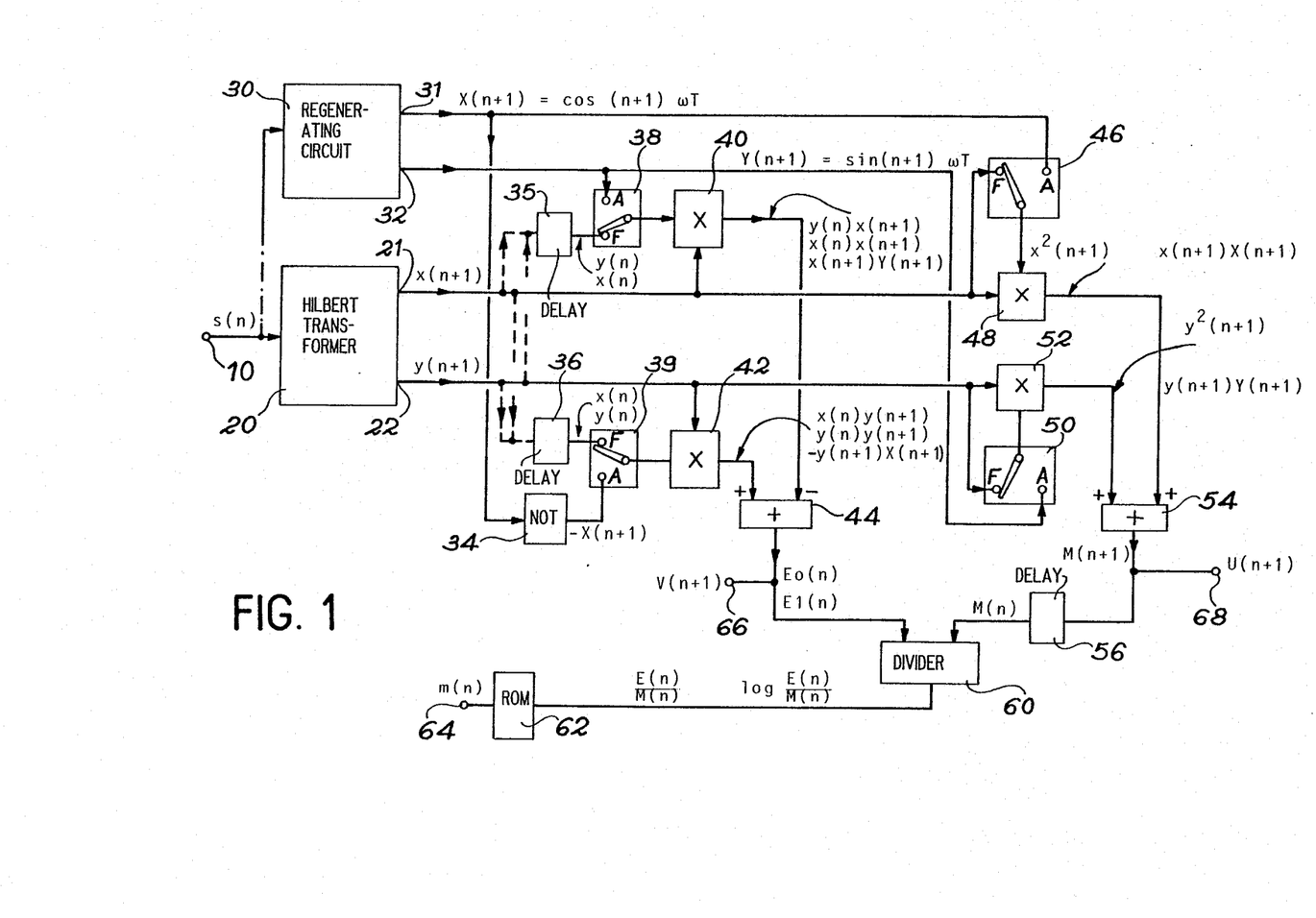
FIG. 1 The general diagram of the double demodulator according to the invention.

FIG. 1 firstly illustrates the general structure of the apparatus. The double digital demodulator shown comprises:

a general input 10 receiving the digital samples s(n) of a modulated signal, in which n is the rank of the sample;

a Hilbert transformer 20 having an input connected to the general input 10 and first and second outputs 21, 22 respectively supplying samples in quadrature x(n+1) and y(n+1);

a carrier regenerating circuit 30 having an input connected to the general input 10 and first and second outputs 31, 32 supplying subcarriers in quadrature X(n+1) and Y(n+1);

a first delay line 35 connected either to the first output 21 of Hilbert transformer 20, or to the second output 22 and supplying a delayed sample x(n) or y(n) of a sampling period;

a second delay line 36 connected either to the second output 22 of the Hilbert transformer 20, or to the first output 21 and supplying a delayed sample y(n) or x(n) of a sampling period;

a first switching device 38 having a first input A connected to the second output 32 of the carrier regenerating circuit 30, a second input F connected to the first delay line 35 and an output;

a second switching device 39 having a first input A connected, via an inverter or NOT circuit 34, to the first output 31 of the carrier regenerating circuit 30, a second input F connected to the second delay line 36 and an output S;

a first multiplier 40 having a first input connected to the output of the first switching device 38 and receiving the sample x(n) or y(n) or the subcarrier Y(n+1) and a second input connected to the first output 21 of the Hilbert transformer 20 and receiving the sample x(n+1), said first multiplier having an output supplying one of the products y(n)x(n+1), x(n)x(n+1), x(n+1)Y(n+1);

a second multiplier 42 having a first input connected to the output of the second switching device 39 and receiving the sample y(n) or x(n) or the subcarrier X(n+1) and a second input connected to the second output 22 of the Hilbert transformer 20 and receiving the sample y(n+1), said second multiplier 42 having an output supplying one of the products x(n)y(n+1), y(n)y(n+1), $-$y(n+1)X(n+1);

a first adder 44 having a first input connected to the output of the first multiplier 40 and a second input which can be inverting and connected to the output of the second multiplier 42, said first adder having an output supplying a signal $E_o(n)$ or $E_1(n)$ or V(n+1);

a third switching device 46 having a first input F connected to the first output 21 of Hilbert transformer 20 and a second input A connected to the first output 31 of the carrier regenerating circuit 30 and an output;

a third multiplier 48 having a first input connected to the first output 21 of the Hilbert transformer 20, a second input connected to the output of the third switching device 46 and an output supplying either $x^2(n+1)$ or x(n+1)X(n+1);

a fourth switching device 50 having a first input F connected to a second output 22 of the Hilbert transformer 20, a second input connected to the second output 32 of the carrier regenerating circuit 30 and an output;

a fourth multiplier 52 having a first input connected to the second output 22 of the Hilbert transformer 20, a second input connected to the output of the fourth switching device 50 and an output supplying either $y(n+1)$, or y(n+1)Y(n+1);

a second adder 54 having a first input connected to the output of the third multiplier 48, a second input connected to the output of the fourth multiplier 52 and an output supplying a quantity M(n+1) or U(n+1);

optionally a third delay line 56 for a sampling period connected to the second adder 54 and supplying the signal M(n);

a divider circuit 60 having a first input connected to the output of the first adder 44 and receiving a signal $E_o(n)$ or $E_1(n)$, a second input connected to the third delay line 56 or, if the latter does not exist, to the second adder 54 and receiving the signal M(n) and an output supplying a quotient signal of $E_o(n)$ or $E_1(n)$ by M(n);

a circuit 62 having an input addressed by the signal appearing at the output of the divider circuit 60 and an output.

Such a demodulator is able to demodulate either a signal s(n) frequency modulated by a modulating signal m(n), in which case the four switching devices 38, 39, 46, 50 are in the position connecting their output to their first input F, the modulating signal m(n) then being available on a general output 64 connected to the output of circuit 62, or a double amplitude modulation signal U(n), V(n) in quadrature and with suppressed carrier, in which case the four switching devices 38, 39, 46, 50 are in the position connecting their output to the second input A, the demodulated signals V(n+1) and U(N+1) being available on two general outputs 66, 68 respectively corresponding to the output of the first 44 and the second 54 adders.

Figure 2:
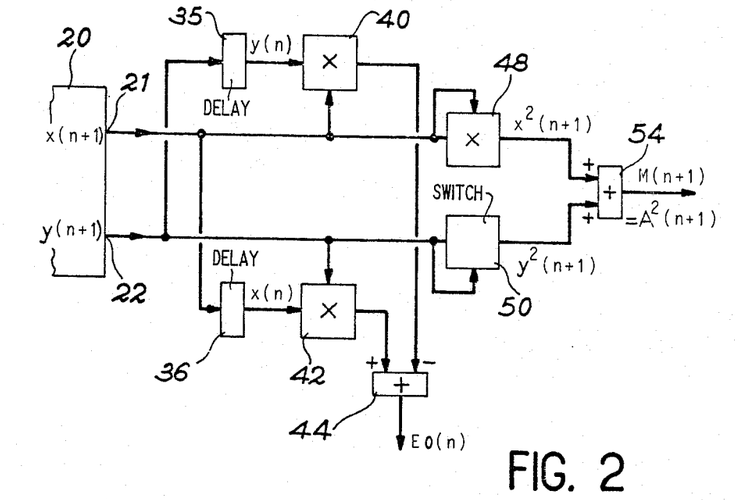
FIG. 2 In the case of a frequency demodulation, a first subassembly able to calculate the quantities Eo(n) and M(n).
Figure 3:
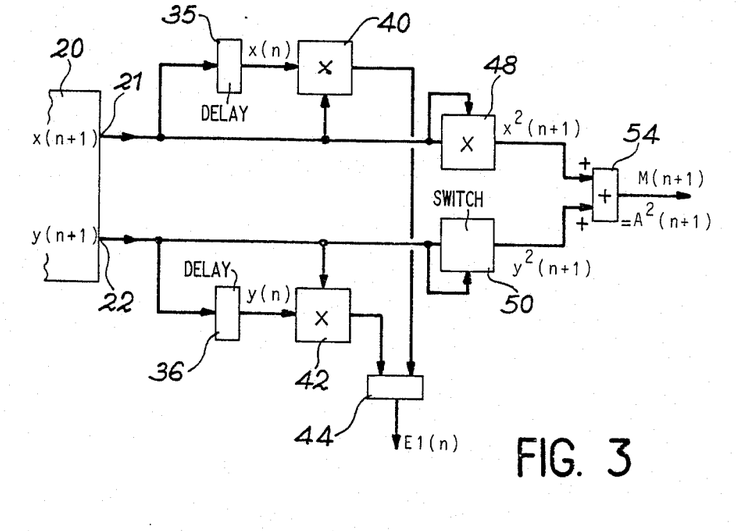
FIG. 3 A second subassembly able to calculate the quantities El(n) and M(n).

According to the type of demodulation to be carried out, the structure of the demodulator assumes different forms, two of which are illustrated in FIGS. 2 and 3. This is the case where the circuit performs a frequency demodulation. Thus, switching devices 38, 39, 46 and 50 are on position F.

FIG. 2 shows the Hilbert transformer 20, delay lines 35, 36, multipliers 40, 42, 48, 50 and adders 44, 54. Adder 44 receives the product x(n)y(n+1) at its non-inverting input and the product y(n)x(x+1) at its inverting input and consequently supplies the quantity:

$$x(n)y(n+1) - y(n)x(n+1)$$

i.e. the quantity $E_o(n)$ defined hereinbefore by relation R4. in the same way, adder 54 receives $x^2(n+1)$ and $y^2(n+1)$ and supplies he quantity $x^2(n+1) + y^2(n+1)$, i.e. M(n+1) according to relation R6, or once again $A^2(n+1)$.

In FIG. 3 the means are the same, but the delay lines 35 and 36 are respectively connected to outputs 21 and 22. Adder-subtractor 44 receives the products y(n)y(n+1) and x(n)x(n+1). In this case, there is no inverting input. The output signal is the sum:

$$x(n)x(n+1)+y(n)y(n+1)$$

i.e. $E_1(n)$ according to relation R5.

Adder 54 receives $x^2(n+1)$ and $y^2(n+1)$ and consequently supplies $M(n+1)$ or $A^2(n+1)$.

In both these devices, circuits 48 and 50 for raising to the square can be multipliers or read-only memories. Thus, the circuit of FIG. 2 makes it possible to calculate the quantity $\sin \Delta\phi$ and the circuit of FIG. 3 the quantity $\cos \Delta\phi$.

For most applications, the structure given in FIG. 3 constitutes the preferred form. This is due to the fact that it leads to the calculation of $\cos \Delta\phi$ which, for a given quantification, makes it possible to determine $\Delta;100$ and therefore m with greater precision than on the basis of $\sin \Delta\phi$ for all the frequencies of the modulated signal with input between fe/8 and 3fe/8, fe designating the sampling frequency.

The algorithm leading to the calculation of $\sin \Delta\phi$ also assumes a knowledge of priori of $\Delta\phi$ to know whether this quantity exceeds or is below 90° and consequently whether the estimated frequency is above or below fe/4.

With the knowledge of $E(n)$ (i.e. either $E_o(n)$ or $E_1(n)$) and $M(n)$, it is necessary to divide the first quantity by the second and then deduct m(n) therefrom. For this purpose, two types of device can lead to the result as a function of whether a product is formed (FIG. 4), or use is made of logarithms (FIGS. 5 and 6).

Figure 4:
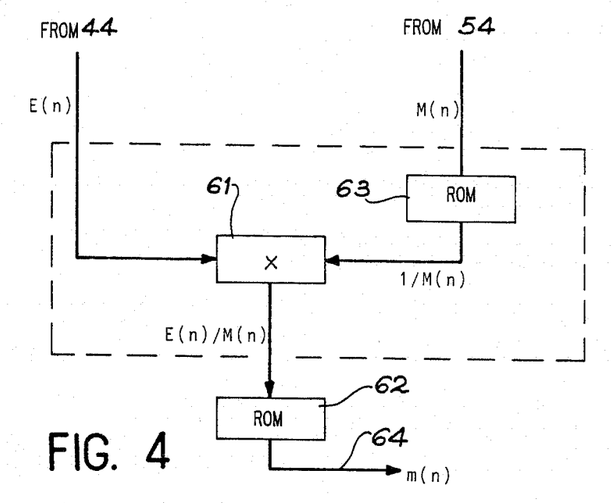
FIG. 4 A first embodiment of a subassembly for extracting the signal demodulated on the basis of signals E(n) and M(n).

The circuit of FIG. 4 is a subassembly having a multiplier 61 forming the product of $E(n)$ by $1/M(n)$, read-only memories, one 63 receiving $M(n)$ for the address and containing the quantities $1/M(n)$ and the other 62 receiving $E(n)/M(n)$ for the address and containing the values of $M(n)$, as given by relations R9 or R10.

Figure 5:
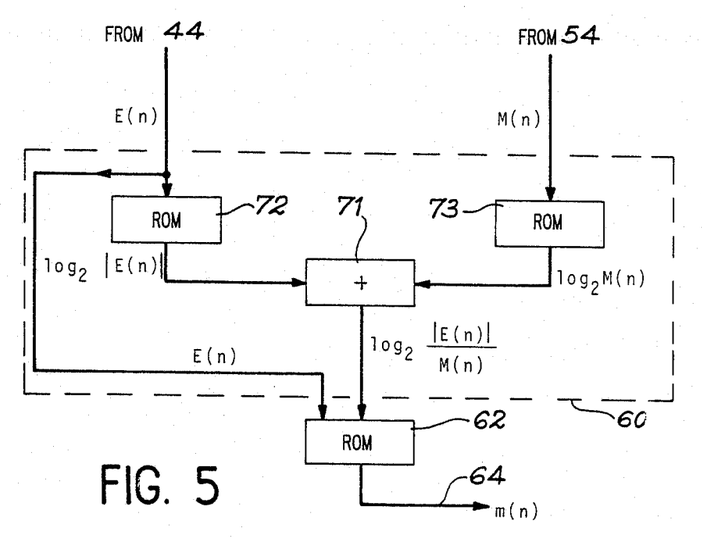
FIG. 5 A second embodiment of realizing a subassembly for extracting the demodulated signal.
Figure 6:
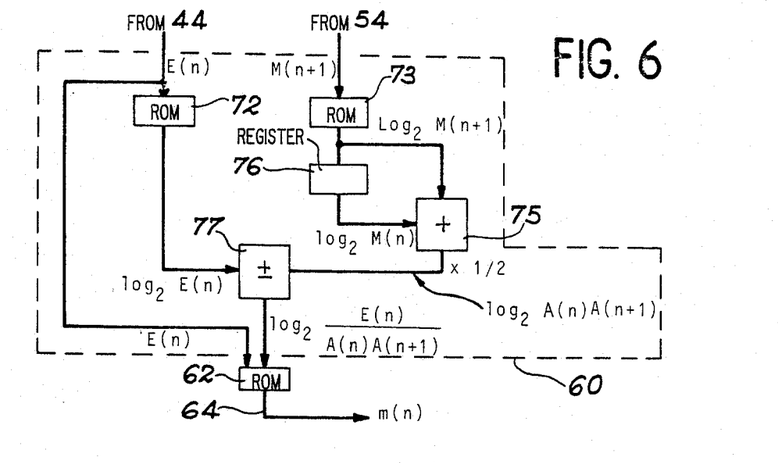
FIG. 6 A third embodiment of a demodulated signal extraction subassembly.

FIG. 5 is a variant of this subassembly having an adder 71 forming the subtraction of $\log_2 E(n)$ and $\log_2 M(n)$ with respect to the read-only memories:

72, 73 receiving $E(n)$ or $M(n)$ for addresses and containing logarithms to base 2 of the absolute values of these quantities, the other 62 receiving $\log_2 [|E(n)|/M(n)]$ for the address and containing the values m(n), according to one or other of the relations:

$$\frac{1}{k\Delta f_0}\left[\frac{1}{2\pi T}\text{Arc sin}\left(2^{\log_2 \frac{E_0(n)}{M(n)}}\right)-f_0\right]$$

$$\frac{1}{k\Delta f_0}\left[\frac{1}{2\pi T}\text{Arc cos}\left(2^{\log_2 \frac{E_1(n)}{M(n)}}\right)-f_0\right]$$
if $E_1(n) > 0$ $$\frac{1}{k\Delta f_0}\left[\frac{1}{2\pi T}\left(\pi - \text{Arc cos}\left(2^{\log_2 \frac{E_1(n)}{M(n)}}\right)\right)-f_0\right]$$
if $E_1(n) < 0$ In the hypothesis where $E_1(n)$ is used as the value of $E(n)$, the read-only memory 62 which supplies m(n) also receives the sign of $E_1(n)$ to the extent that a knowledge a priori of the frequency to be demodulated (f>fe/4 or f<fe/4) would not make it possible to know beforehand whether $\Delta\phi$ is above or below 90°.

FIG. 6 shows a variant of the invention based on the same structure as that given in FIG. 5. It has two read-only memories 72, 73 supplying logarithms of $E(n)$ and $M(n+1)$, an adder 75 and a register 76 making it possible to delay the signal by a sampling period and an adder-subtractor 77. Adder 75 supplies the quantity:

$$\tfrac{1}{2}<\log_2 M(n)+\log_2 M(n+1)>,$$

i.e. $\log_2 A(n)A(n+1)$.

Adder-subtractor 77 supplies the quantity $\log_2 (E(n)/A(n)A(n+1))$. The modulating signal m(n) can therefore be determined on the basis of exact expressions and no longer on the basis of approximate relations given by R7 and R8.

In the preceding circuits, $M(n)$ or $M(n+1)$, i.e. definitively the square of the amplitude of the input signal $A^2(n)$ or $A^2(n+1)$ is obtained. In the case of an amplitude demodulation, it is therefore sufficient to extract the information $A(n)$, the means for calculating $E_o(n)$ or $E_1(n)$ then being of no use.

Moreover, by means of one or other of the three informations $A(n)$, $M(n)$ or $\log_2 M(n)$, an information is available making it possible to act on the gain of the input signal at a random location of the chain preceding the Hilbert transformer, so as to avoid the saturation of the demodulation circuits and to maintain the input level adjusted to the best of the performances thereof.

Figure 7:
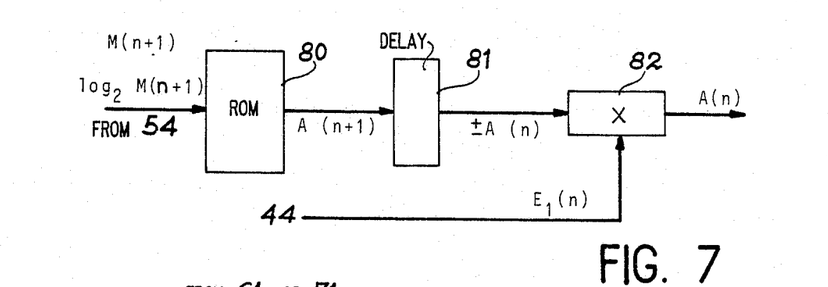
FIG. 7 An arrangement making it possible to obtain the amplitude of the input signal.

In the hypothesis of an amplitude modulation with suppressed carrier, the proposed circuit remains usable. Use is then made of the information $E_1(n)$ and an a priori knowledge of the carrier frequency, i.e. $\Delta\phi$, for determining the sign of the demodulated signal $A(n)$ which, according to the particular case, will be that of $E_1(n)$ or the opposite sign. The arrangement is then as shown in FIG. 7. It comprises a read-only memory 80 receiving $M(n+1)$ from circuit 54 or $\log_2 M(n+1)$ from circuit 73. It supplies $A(n+1)$, which is applied to a delay line by a period 81. A multiplier 82 makes it possible to supply $A(n)$ with its correct sign, if the sign of $E_1(n)$ is applied thereto.

In the hypothesis where a phase modulation is substituted for the frequency modulation, the modulated wave phase increment expression becomes:

$$\Delta\phi(n+1)=2\pi f_o T+k\phi(m(n+1)-m(n))$$

$k\phi$ representing the slope of the modulation.

The knowledge of $\Delta\phi(n+1)$ leads to that of a $\Delta m(n+1)$, so that:

$$\Delta m(n+1)=m(n+1)-m(n)=1/k\phi(\Delta\phi-2\pi f_o T).$$

Knowing $\Delta m$, the modulating signal can be gathered therefrom by $m(n+1)=m(n)+\Delta m(n+1)$.

Figure 8:
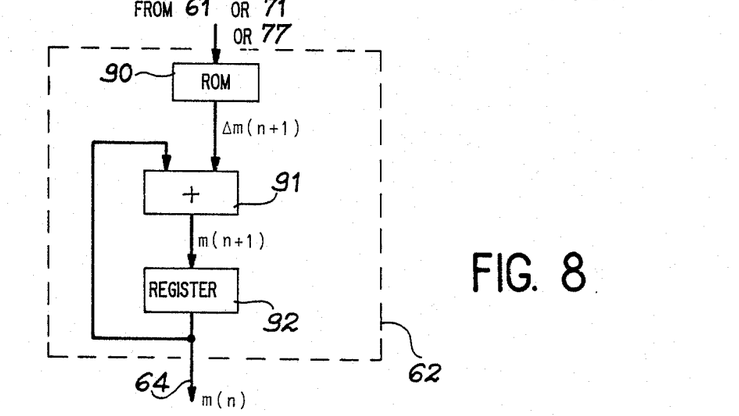
FIG. 8 A subassembly for the extraction of the modulating signal in the case of a phase demodulation.

For this purpose, it is possible to use the circuit of FIG. 8. It comprises a read-only memory 90, which receives $E(n)/M(n)$ or $\log_2 (E(n)/M(n))$ or $\log_2 (E(n)/A(n)A(N+1))$ and supplies $\Delta m(n+1)$. The circuit also comprises an accumulator constituted by an adder 91 and a register for delaying by a clock period 92, whose output is relooped on the input of adder 91.

After describing the various embodiments of the circuit according to the invention in the case of frequency, phase or amplitude demodulation, the case will now be envisaged of an amplitude demodulation for signals with double demodulation in quadrature and suppressed carrier.

Figure 9:
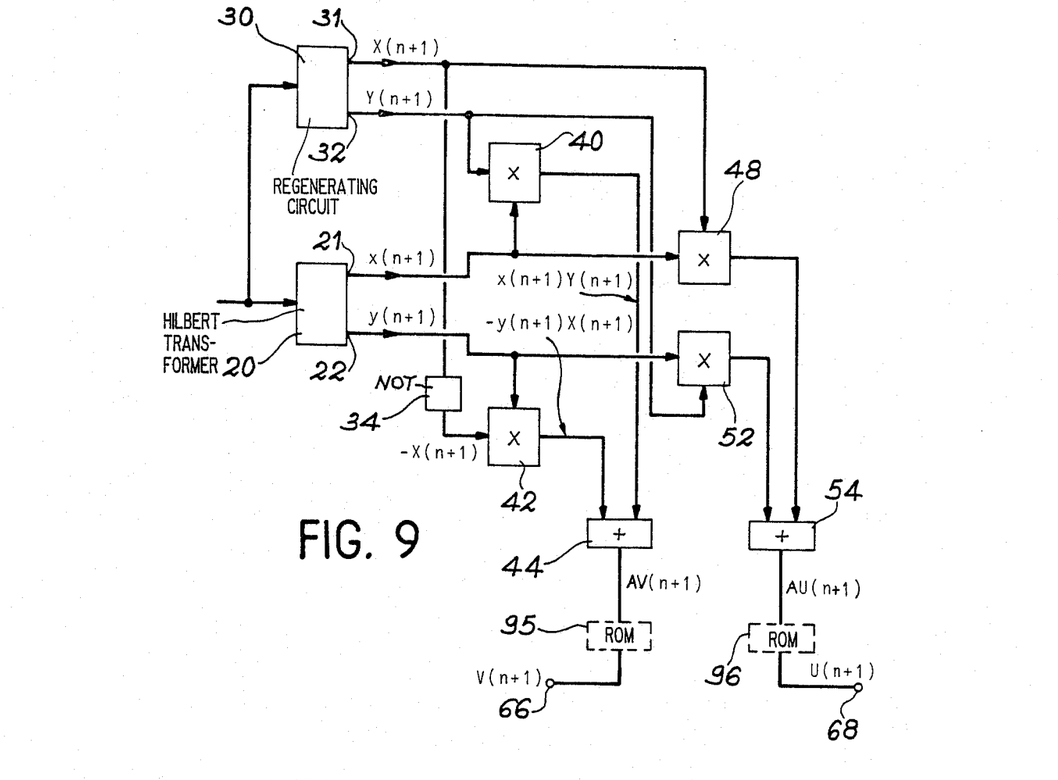
FIG. 9 The structure of the demodulator in the case of a demodulation of signals having double modulation in quadrature and with suppressed carrier.

As explained hereinbefore, it is in this case necessary to have two subcarriers in quadrature. The carrier regenerating signal 31 must therefore be used. This is brought about by switching the switching devices 38, 39, 46, 50 in order to connect their input A (and no longer F).

FIG. 9 shows the circuit obtained, which has the Hilbert transformer 20, subcarrier regenerating circuit 30, multipliers 40, 42, 48, 52, the inverter or NOT circuit 34 and adders 44 and 54. Multiplier 40 delivers the product $x(n+1)Y(n+1)$, multiplier 42 the product $-y(n+1)X(n+1)$. Adder 44 consequently delivers the quantity $x(n+1)Y(n+1)-y(n+1)X(n+1)$, i.e. $AV(n+1)$ in accordance with relation R12. In the same way, multiplier 48 delivers the product $x(n+1)X(n+1)$ and multiplier 52 the product $y(n+1)Y(n+1)$. Adder 54 supplies the sum $x(n+1)X(n+1)+y(n+1)Y(n+1)$, i.e. $AU(n+1)$ according to relation R11.

It is optionally possible to add to the circuit read-only memories 95, 96, if A is not equal to 1.

In all these embodiments, the present invention has a device 20 called a Hilbert transformer. The latter receives the input signal to be demodulated and supplies therefrom two versions in quadrature. This device comprises a transverse digital filter, whose amplitude-frequency response is as close as possible to unity in the entire useful band of the signal to be demodulated.

Figure 10:
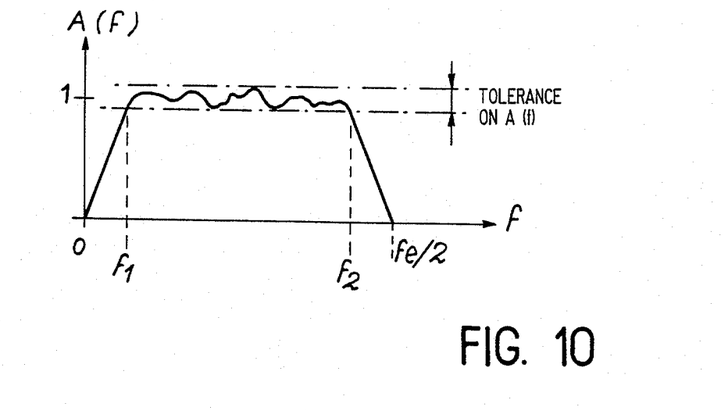
FIG. 10 The amplitude-frequency response of a Hilbert transformer.

In the present invention this digital filter is characterized in that:

it has a finite length pulse response.

the total number of its coefficients is uneven, its pulse response is uneven, in other words the coefficients on either side of the central coefficient have in pairs the same modulus, but opposite signs ($a_i = -a_{-i}$), all the coefficients of even rank are zero: $a_0 \equiv a_{\pm 2} = a_{\pm 4} \equiv a_{\pm 2p} = 0$ FIG. 10 gives a representation of the amplitude-frequency response. Frequencies $f_1$ and $f_2$ are dependent on the coefficients of the transformer and we obtain: $f_2 = (fe/2) - f_1$, fe designating the sampling frequency.

The Hilbert transformers, whose structure has been described are characterized by the fact that they perform a precise quadrature between their output signals and that the accuracy of the transformation is dependent on the accuracy of the amplitude-frequency response, which makes it possible to define a certain useful band for the transformer.

The following examples correspond to transformers characterized in that, whilst being accurate around 0.1 dB on a broad band, there are a smaller number of simpler coefficients. The latter only have a few bits equal to unity. Thus, all the coefficients only have two bits equal to unity and they can be realized by adders.

Figure 11:
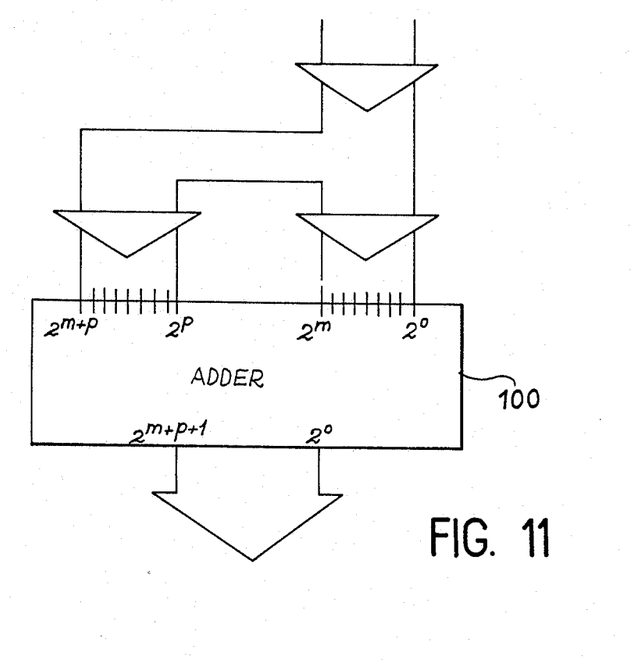
FIG. 11 A means permitting the multiplication of an item by a coefficient by means of an adder.

More specifically, it is a question of multiplying an input quantity e by a number having two bits equal to 1, said number being written $a = 2^q + 2^p$. For example, if $q=0$, we obtain $a = 2^o + 2^p$. This multiplication can be performed by an adder 100, as shown in FIG. 11. The inputs of $2^0$ to $2^m$ receive the signal e assumed to be $m+1$ bits, which is also applied to the other channel of the adder to the inputs of weight $2^p$ to $2^{m+p}$. The output supplies the signal $e(2^o + 2^p)$.

For example, with $a=5$, there are two bits equal to 1: $1+2^2 = 101$ and it is possible to carry out the multiplication by 5 using an adder with two input groups displaced by 2.

The following table gives certain examples of Hilbert transformers. In this table, the notation TH designates the type of transformer (4 types are provided), the value of the multiplier coefficient x, the value of the coefficients $a_1, a_3, a_5, a_6$, the number of n bits equal to 1 for each coefficient (e.g. for a coefficient equal to 12, we obtain $12 = 1100$, i.e. $n = 2$). When this number does not exceed 2, it is possible to use adders (Add), as described relative to FIG. 11, otherwise read-only memories will be used (MM). The tables gives the performances obtained.

TABLE 1

| Transformer | | Coefficients | | | | Performances |
|---|---|---|---|---|---|---|
| | | $a_1$ | $a_3$ | $a_5$ | $a_7$ | |
| TH1 | Values | | | | | |
| | × 1/256 | 157 | 39 | 12 | 3 | Response between 0 dB and −0.1 dB |
| | n | 5 | 4 | 2 | 2 | from 0.1 fe to 0.4 fe |
| | Realisation | MM | MM | Add | Add | |
| TH2 | Values | | | | | |
| | × 1/128 | 78 | 18 | 5 | 1 | Response between +0.02 dB and −0.1 dB |
| | n | 4 | 2 | 2 | 1 | |
| | Realisation | MM | Add | Add | — | from 0.116 fe to 0.384 fe |
| TH3 | Values | | | | | |
| | × 1/128 | 78 | 17 | 4 | | Response between +0.13 dB and −0.13 dB |
| | n | 4 | 2 | 1 | | |
| | Realisation | MM | Add | — | | from 0.107 fe to 0.393 fe |
| TH4 | Values | | | | | |
| | 1/64 | 37 | 5 | | | Response between 0 dB and −0.5 dB |
| | n | 3 | 2 | | | from $\frac{fe}{8}$ to $\frac{3fe}{8}$ |
| | Realisation | MM | | | | |

The following examples relate to transformers having a simple structure applicable inter alia to the demodulation of SECAM, PAL and NTSC color television signals.

Figure 12:
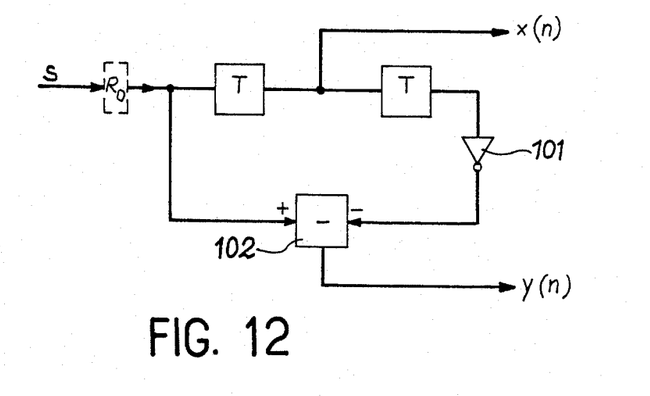
FIG. 12 A first embodiment of a Hilbert transformer.

Hereinafter, T, 2T, 3T, etc. are used for designating delay lines introducing delays of one, two, three, etc. sampling periods and $R_1, R_2, R_3$, etc. optional registers. The first example relates to a Hilbert transformer obtained by simple mean (a single coefficient $a_i = \frac{1}{2}$). This device can be used in all hypotheses, where the modulated signal occupies a frequency band close to one quarter the sampling frequency, such as the case of a chrominance signal of the NTSC system sampled at a frequency of 13.5 MHz. Its response is between 0 and −0.1 dB for frequencies between 0.226 and 0.274 fe. This is shown in FIG. 12. It comprises two delay lines T, an inverter 101 and a subtractor 102.

Figure 13:
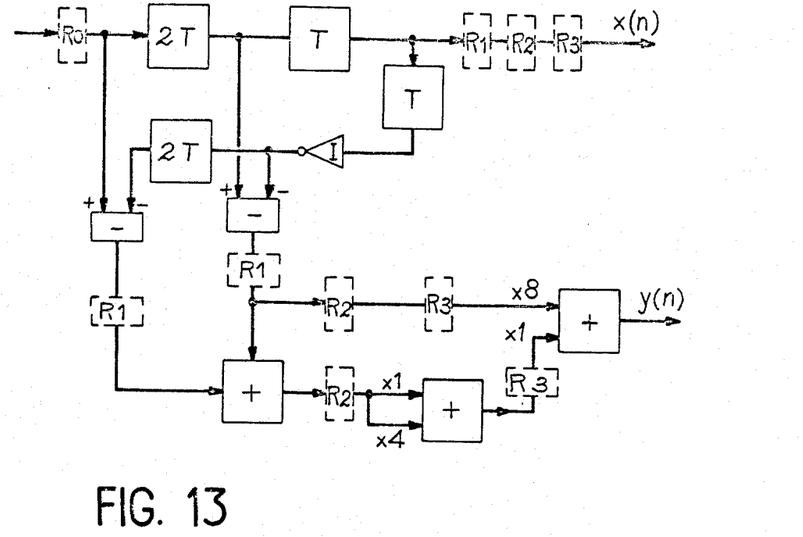
FIG. 13 A second embodiment of a Hilbert transformer.

In contexts of this type, better performances can be obtained for wide sampling frequency ranges by using the transformers appearing in table 1, references TH3 and TH4. FIG. 13 gives a special construction of the transformer TH4 only using adders and utilizing the fact that the coefficients can be written $a_1 = \frac{1}{2} + 5/64$ and $a_2 = 5/64$, it being possible to use the coefficient 5 as the common factor.

In FIG. 13, $R_0, R_1, R_2$ and $R_3$ are optional registers. Registers $R_1, R_2$ and $R_3$ supplying x(n), when they are not otherwise necessary, can be avoided by taking x(n) at intermediate points between the delay elements T, 2T and ensuring that the correct polarity of the data is retained.

Figure 14:
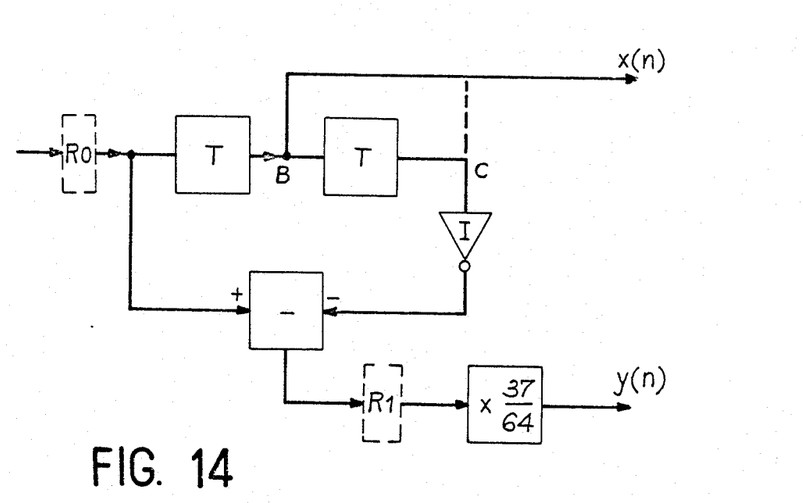
FIG. 14 A third embodiment of a Hilbert transformer.

A final type of transformer is applicable in the case of SECAM and PAL signals sampled at a frequency of 13.5 MHz. It is then possible to perform a transformation with a single coefficient $a_1 = 37/64$. The response thereof remains sufficiently close to unity in the useful band of the chrominance signals to retain adequate performances. FIG. 14 gives a representation of this transformer. In FIG. 14, registers $R_0$ and $R_1$ are optional. When a register $R_1$ is necessary, the output of $x(n)$ is at point C and not at point B.

The element designated $x(37/64)$ is constituted either by a read-only memory, or by two adder stages, whereof the first, by calling e the input data, calculates $e + 4e = 5e$ and the second $5e + 32e = 37e$.

Figure 15:
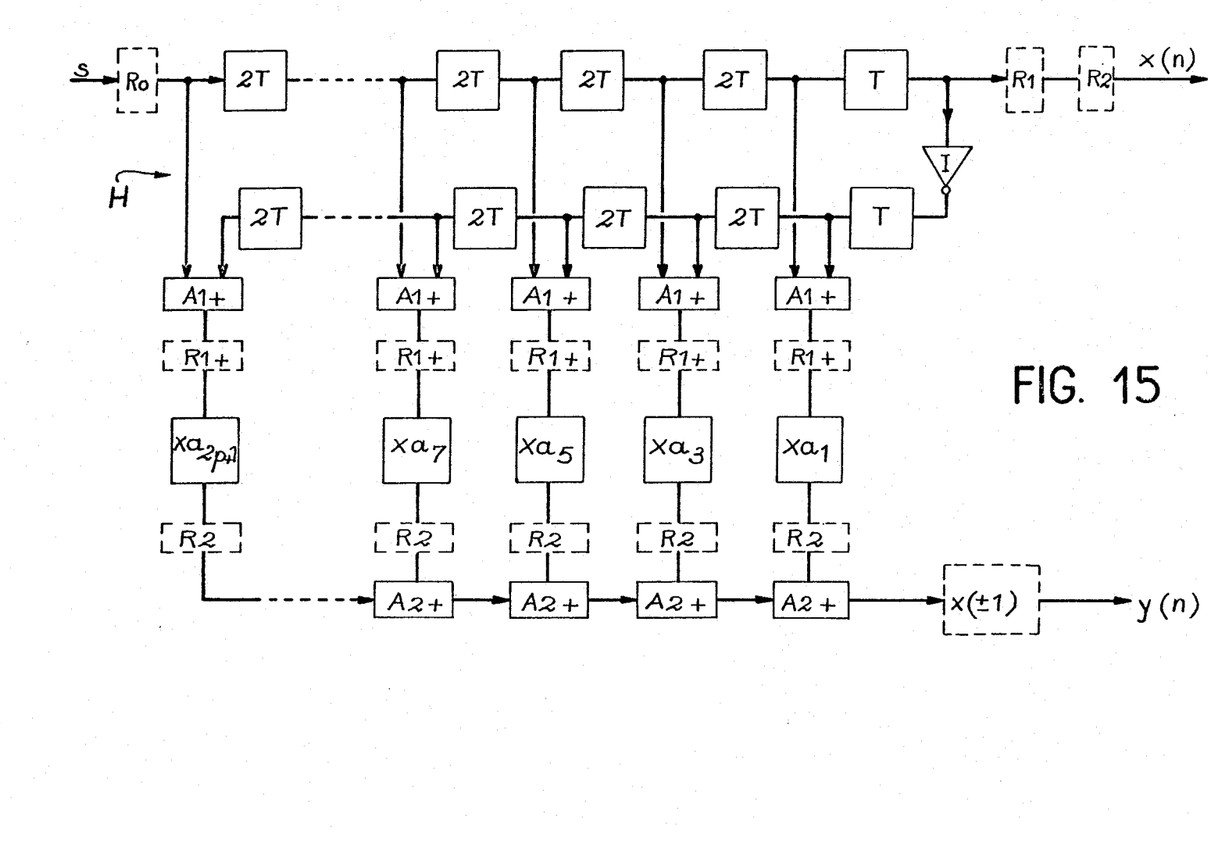
FIG. 15 A fourth embodiment of a Hilbert transformer.
Figure 16:
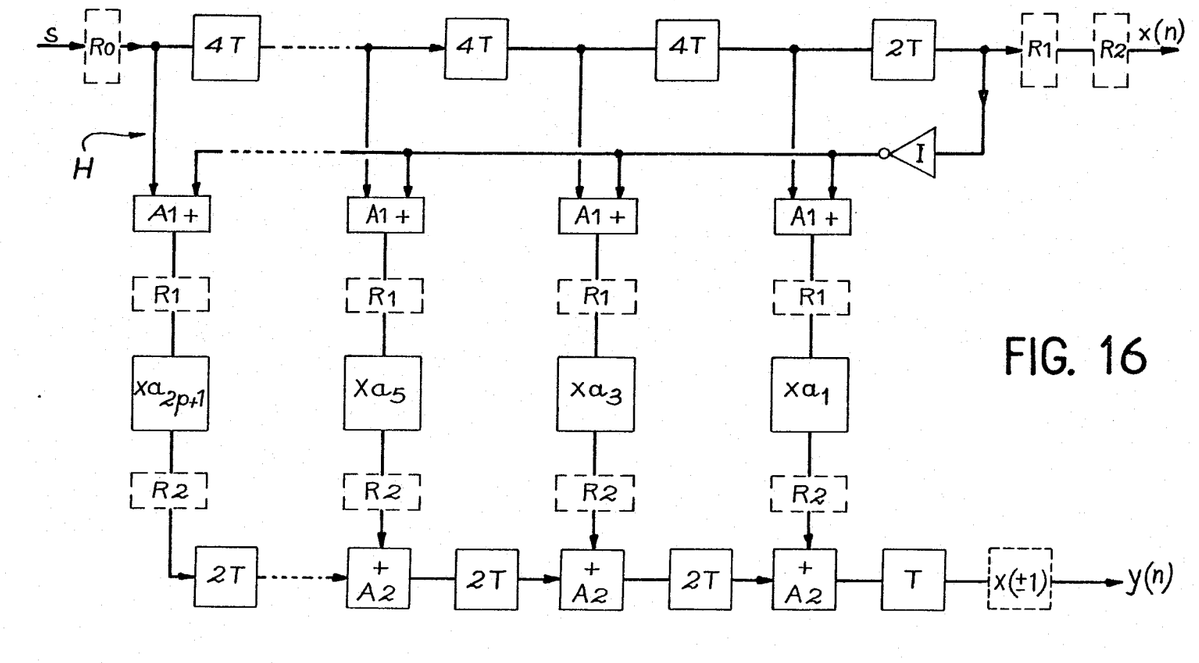
FIG. 16 A fifth embodiment of a Hilbert transformer.
Figure 17:
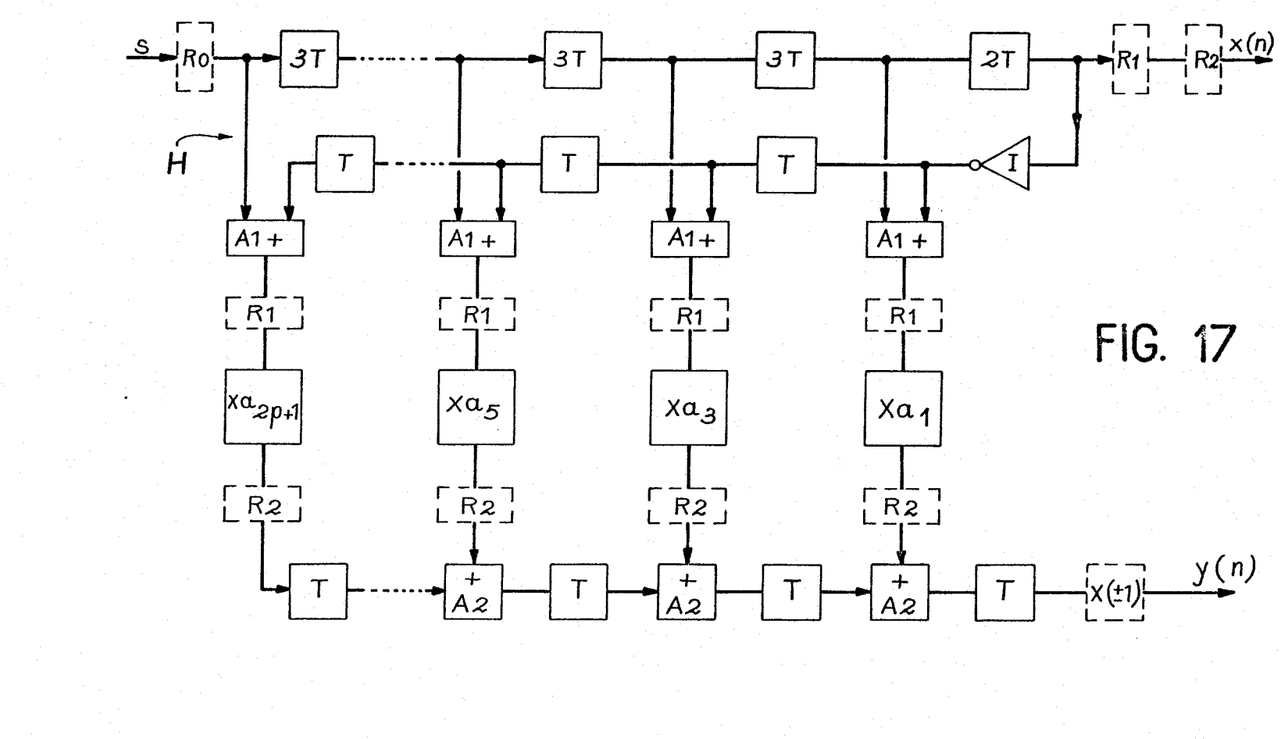
FIG. 17 A sixth embodiment of a Hilbert transformer.

FIGS. 15, 16 and 17 illustrate three basic structures usable in the present invention for forming the Hilbert transformer. These three variants have similar structures and comprise:

an optional input register $R_0$ for taking account of the input data;

a delay line for distributing the input data constituted by registers permitting, according to requirements, the displacement of the input data by T, 2T, 3T or 4T, T being the period of the clock signal supplying the device;

an inverter or NOT circuit 1, if necessary integrated into the aforementioned register (FIGS. 14, 16 nd 17), in which case the inversion must be compensated to remove the data $x(n)$ with good polarity or with the following register (FIG. 15)—the function of said inverter with the input data coded in "complement 2" form, is to prepare the inversion of the sign thereof, which is brought about by adding a "1" (high binary level) to the least significant bit of each of the adders Al;

a group of adders A1 making it possible to carry out the subtraction between an input data item and another data item delayed by a certain number of clock periods;

a group of operators $Xa_{2p+1}$ for producing the product of the signal passing out of an adder A1 belonging to said coefficient, said operators being released by using adders or read-only memories, as described hereinbefore;

optionally registers $R_1$ and $R_2$ which, for rapid versions of the system, serve to mask the transit times in the circuits preceding them, the delays introduced by these registers being compensated by identical registers placed on the output supplying the data $x(n)$;

a series of adders A2 optionally separated by registers introducing delays T or 2T, which serve to summate all the results of the calculations leading to data $y(n)$;

optionally an output device making it possible to change the sign of $y(n)$ and therefore the direction of the quadrature (front or rear) of said data with respect to the data $x(n)$.

The difference between these three variants is solely based on the distribution of the delay elements for the input data and output data (register separating the adders A2).

For a given number of coefficients, the transformer of FIG. 15 requires the smallest total number of delay elements. However, it assumes fast circuits, i.e. able to perform all the additions performed by adders A2 in less than one clock period.

The structures given in FIGS. 16 and 17 do not meet these speed requirements. FIG. 16 leads to the highest number of registers, but the simpler distribution of the input data from adders Al can be an advantage.

We claim:

1. Double digital demodulator, characterized in that it comprises:

a general input (10) receiving the digital samples s(n) of a modulated signal, in which n is the rank of the sample;

a Hilbert transformer (20) having an input connected to the general input (10) and first and second outputs (21, 22) respectively supplying samples in quadrature $x(n+1)$ and $y(n+1)$;

a carrier regenerated circuit (30) having an input connected to the general input (10) and first and second outputs (31, 32) supplying subcarriers in quadrature $X(n+1)$ and $Y(n+1)$;

a first delay line (35) connected either to the first output (21) of Hilbert transformer (20), or to the second output (22) and supplying a delayed sample $x(n)$ or $y(n)$ of a sampling period;

a second delay line (36) connected either to the second output (22) of the Hilbert transformer (20), or to the first output (21) and supplying a delayed sample $y(n)$ or $x(n)$ of a sampling period;

a first switching device (38) having a first input (A) connected to the second output (32) of the carrier regenerating circuit (30), a second input (F) connected to the first delay line (35) and an output;

a second switching device (39) having a first input (A) connected, via an inverter or NOT circuit (34), to the first output (31) of the carrier regenerating circuit (30, a second input (F) connected to the second delay line (36) and an output (S);

a first multiplier (40) having a first input connected to the output of the first switching device (38) and receiving the sample $x(n)$ or $y(n)$ or the subcarrier $Y(n+1)$ and a second input connected to the first output (21) of the Hilbert transformer (20) and receiving the sample $x(n+1)$, said first multiplier having an output supplying one of the products $y(n)x(n+1)$, $x(n)x(n+1)$, $x(n+1)Y(n+1)$;

a second multiplier (42) having a first input connected to the output of the second switching device (39) and receiving the sample $y(n)$ or $x(n)$ or the subcarrier $X(n+1)$ and a second input connected to the second output (22) of the Hilbert transformer (20) and receiving the sample $y(n+1)$, said second multiplier (42) having an output supplying one of the produces $x(n)y(n+1)$, $y(n)y(n+1)$, $-y(n+1)X(n+1)$;

a first adder (44) having a first input connected to the output of the first multiplier (40) and a second input which can be inverting and connected to the output of the second multiplier (42), said first adder having an output supplying a signal $E_o(n)$ or $E_1(n)$ or $V(n+1)$;

a third switching device (46) having a first input (F) connected to the first output (21) of Hilbert transformer (20) and a second input (A) connected to the first output (31) of the carrier regenerating circuit (30) and an output;

a third multiplier (48) having a first input connected to the first output (21) of the Hilbert transformer (20), a second input connected to the output of the third switching device (46) and an output supplying either $x^2(n+1)$ or $x(n+1)X(n+1)$;

a fourth switching device (50) having a first input (F) connected to a second output (22) of the Hilbert transformer (20), a second input connected to the second output (32) of the carrier regenerating circuit (30) and an output;

a fourth multiplier (52) having a first input connected to the second output (22) of the Hilbert transformer (20), a second input connected to the output of the fourth switching device (50) and an output supplying either y(n+1), or y(n+1)Y(n+1);

a second adder (54) having a first input connected to the output of the third multiplier (48), a second input connected to the output of the fourth multiplier (52) and an output supplying a quantity M(n+1) or U(n+1);

optionally a third delay line (56) for a sampling period connected to the second adder (54) and supplying the signal M(n);

a divider circuit (60) having a first input connected to the output of the first adder (44) and receiving a signal $E_o(n)$ or $E_1(n)$, a second input connected to the third delay line (56) or, if the latter does not exist, to the second adder (54) and receiving the signal M(n) and an output supplying a quotient signal of $E_o(n)$ or $E_1(n)$ by M(n) or the logarithm of this ratio;

a circuit (62) having an input addressed by the signal appearing at the output of the divider circuit (60) and an output; said demodulator being able to demodulate:

either a signal s(n) modulated in frequency or in phase and in amplitude by a modulating signal m(n), in which case the four switching devices (38, 39, 46, 50) are in the position connecting their output to the first input (F), the modulating signal m(n) then being available on a general output (64) connected to the output of circuit (62), the amplitude being available by its square, at the output (68) of the second adder (54), or a double modulation amplitude signal U(n), V(n) in quadrature and with suppressed carrier, in which case the four switching devices (38, 39, 46, 50) are in the position connecting their output to the second input (A), the demodulated signals V(n+1) and U(n+1) being available on two general outputs (66, 68) respectively corresponding to the output of the first (44) and the second (54) adders.

2. Double digital demodulator according to claim 1, characterized in that the divider circuit (60) comprises a read-only memory (63) receiving the signal M(n) as the address and supplying the reverse signal 1/M(n) and a multiplier (61) with two inputs, one receiving E(n) and the other 1/M(n) and an output supplying the ratio E(n)/M(n).

3. Double digital demodulator according to claim 1, characterized in that the divider circuit (60) comprises two read-only memories (72, 73), the first receiving E(n) and the second M(n) and respectively supplying the logarithm to base (2) of the absolute value of E(n) and the logarithm of M(n) and a subtractor (71) receiving these logarithms and supplying on the one hand the logarithm of the quotient and on the other a signal defining the sign of E(n).

4. Double digital demodulator according to claim 1, characterized in that the divider circuit (60) comprises a first read-only memory (72) receiving E(n) and supplying the logarithm of this quantity, i.e. log E(n), a second read-only memory (73) receiving M(n+1) and supplying the logarithm of said quantity, i.e. log M(n+1), a delay line by a period (76) receiving log M(n+1) and supplying log M(n), an adder (75) receiving log M(n) and log M(n+1) and supplying the half-sum of these logarithms, a subtractor (77) receiving said half-sum on the negative input and log E(n) on the positive input and supplying a signal applied to the output circuit (62).

* * * * *